(12) United States Patent
Yong et al.

(10) Patent No.: US 8,120,056 B2
(45) Date of Patent: Feb. 21, 2012

(54) LIGHT EMITTING DIODE ASSEMBLY

(75) Inventors: Lig Yi Yong, Simpang Ampat (MY);
Kean Loo Keh, Gelugor (MY); Keat Chuan Ng, Bayan Lepas (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 106 days.

(21) Appl. No.: 12/581,811

(22) Filed: Oct. 19, 2009

(65) Prior Publication Data
US 2011/0089460 A1 Apr. 21, 2011

(51) Int. Cl.
*H01L 33/00* (2010.01)
(52) U.S. Cl. ............ 257/99; 257/E33.056; 257/E33.075
(58) Field of Classification Search .............. 257/99, 257/E33.056, E33.075, 706, 707, 100; 362/373, 362/294, 249.02
See application file for complete search history.

(56) References Cited

U.S. PATENT DOCUMENTS

| | | | |
|---|---|---|---|
| 7,202,561 B2 | 4/2007 | Seo | |
| 7,456,499 B2 | 11/2008 | Loh et al. | |
| 7,498,204 B2 | 3/2009 | Kerr et al. | |
| 2004/0065894 A1* | 4/2004 | Hashimoto et al. | 257/100 |
| 2004/0075100 A1 | 4/2004 | Bogner et al. | |
| 2004/0126913 A1 | 7/2004 | Loh | |
| 2005/0131735 A1* | 6/2005 | DeGeorge et al. | 705/2 |
| 2005/0135105 A1* | 6/2005 | Teixeira et al. | 362/294 |
| 2005/0161806 A1 | 7/2005 | Divakar et al. | |
| 2008/0278954 A1* | 11/2008 | Speier | 362/373 |
| 2008/0303052 A1 | 12/2008 | Lee et al. | |

FOREIGN PATENT DOCUMENTS

WO  WO2006105644  * 10/2006

* cited by examiner

*Primary Examiner* — Thomas L Dickey
*Assistant Examiner* — Nikolay Yushin

(57) ABSTRACT

An electronic assembly includes a Light Emitting Diode (LED) mounted on a top surface of a heat spreader, at least two electrical contacts co-planar with the heat spreader, and at least one heat slug mounted on the top surface of the heat spreader, where the heat slug is made of high thermal conductive plastic.

16 Claims, 5 Drawing Sheets

LIGHT EMITTING DIODE ASSEMBLY

Light emitting diodes (LED's) are semiconductor devices that emit light when they are forward biased and current is flowing. There is an ongoing demand for increasing light intensity, resulting in higher currents, and more heat. Heat is detrimental to the performance of a LED because light output generally drops with increasing temperature. In addition, the life of a LED device may be shortened by high temperatures. Therefore, heat removal is extremely important in systems using LED's.

Semiconductor LED devices are typically mounted on a substrate that is part of a package, and the package is attached to a circuit board (for example, by soldering). Sometimes, a LED package includes a heat slug (a mass of metal, typically copper) between the semiconductor die and the printed circuit board, and heat generated by the LED is dissipated by the heat slug, or transferred through the heat slug to heat dissipating structures on the printed circuit board.

There is an ongoing need for LED devices with improved heat dissipation, reduced manufacturing complexity, and lower cost.

DETAILED DESCRIPTION

Figure 1A:
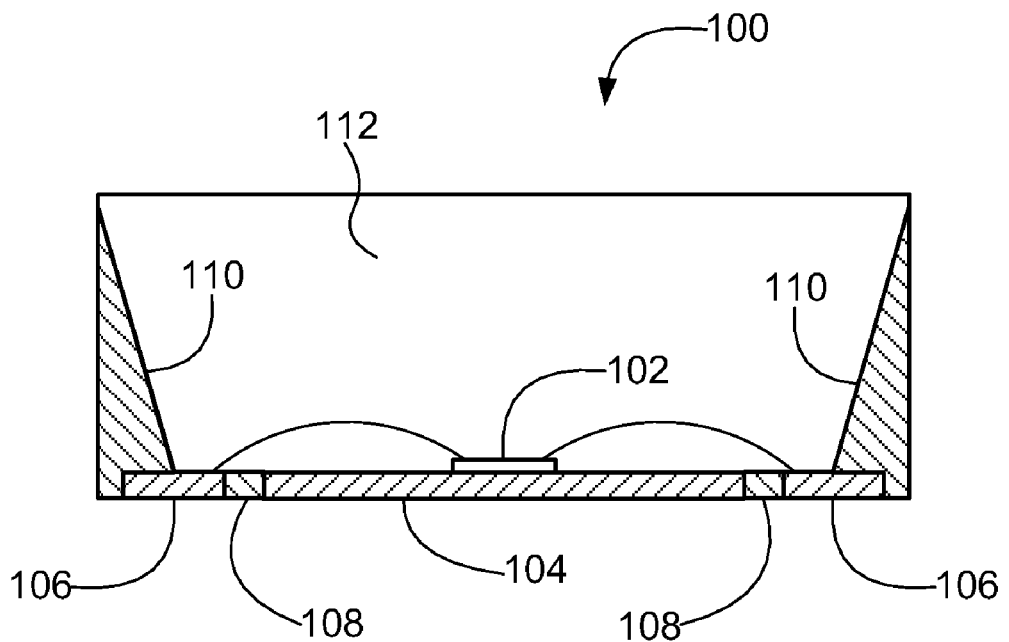
FIG. 1A is a cross-section side view illustrating an example embodiment of a LED package.

FIG. 1A illustrates an example embodiment of a LED package 100. A LED semiconductor die 102 is mounted onto a heat spreader 104. The semiconductor die 102 is wire bonded to two electrical contacts 106. The heat spreader 104 and the electrical contacts 106 are stamped from a metal sheet, for example, copper, aluminum, or iron. A non-conductive plastic 108 electrically insulates the electrical contacts 106 from the heat spreader 104. A reflector 110 may also be molded from the non-conductive plastic 108. The package may be encapsulated, for example, in epoxy or silicone (112). The electrical contacts 106 are exposed at the bottom exterior of the package for attaching to a substrate, for example by soldering to a PC board. The heat spreader 104 may also be exposed at the bottom exterior of the package to facilitate heat transfer through the bottom of the package to an attached substrate.

Figure 1B:
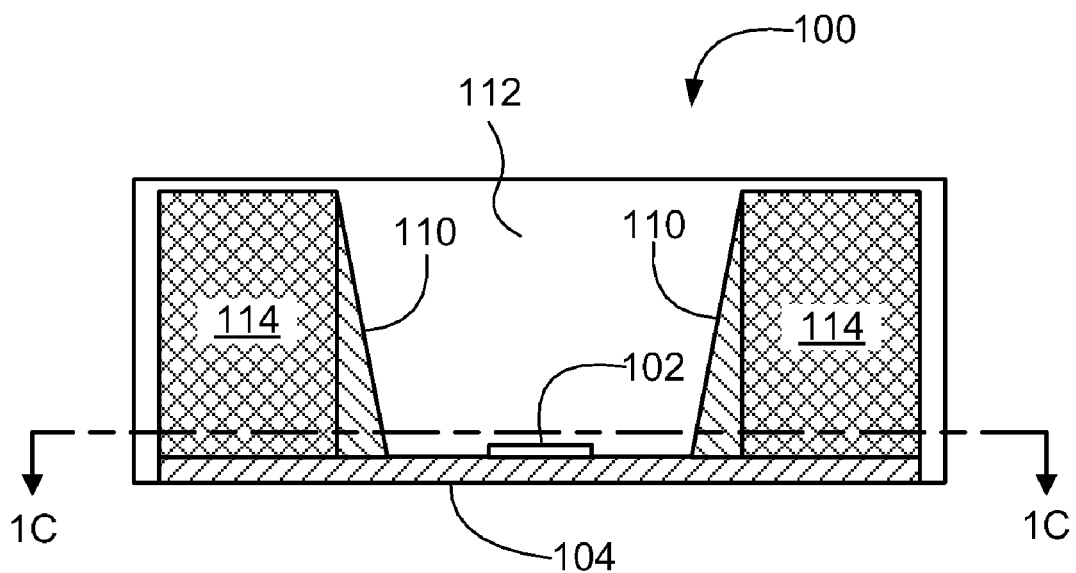
FIG. 1B is a cross-section side view orthogonal to the cross-section of FIG. 1A.

FIG. 1B illustrates a cross-section side view orthogonal to the cross-section of FIG. 1A. In FIG. 1B, at least one heat slug 114, made of high thermal conductive plastic, is mounted on top of the heat spreader 104. In the example of FIG. 1B, heat flows from the semiconductor die 102 through the heat spreader 104 into the top mounted heat slug(s) 114, where it is dissipated through the top of and sides of the package 100. The package may also be mounted onto a substrate (not illustrated), for example a printed circuit board, and heat may also be conducted through the heat spreader 104 to heat dissipating structures (not illustrated) on the substrate.

Figure 1C:
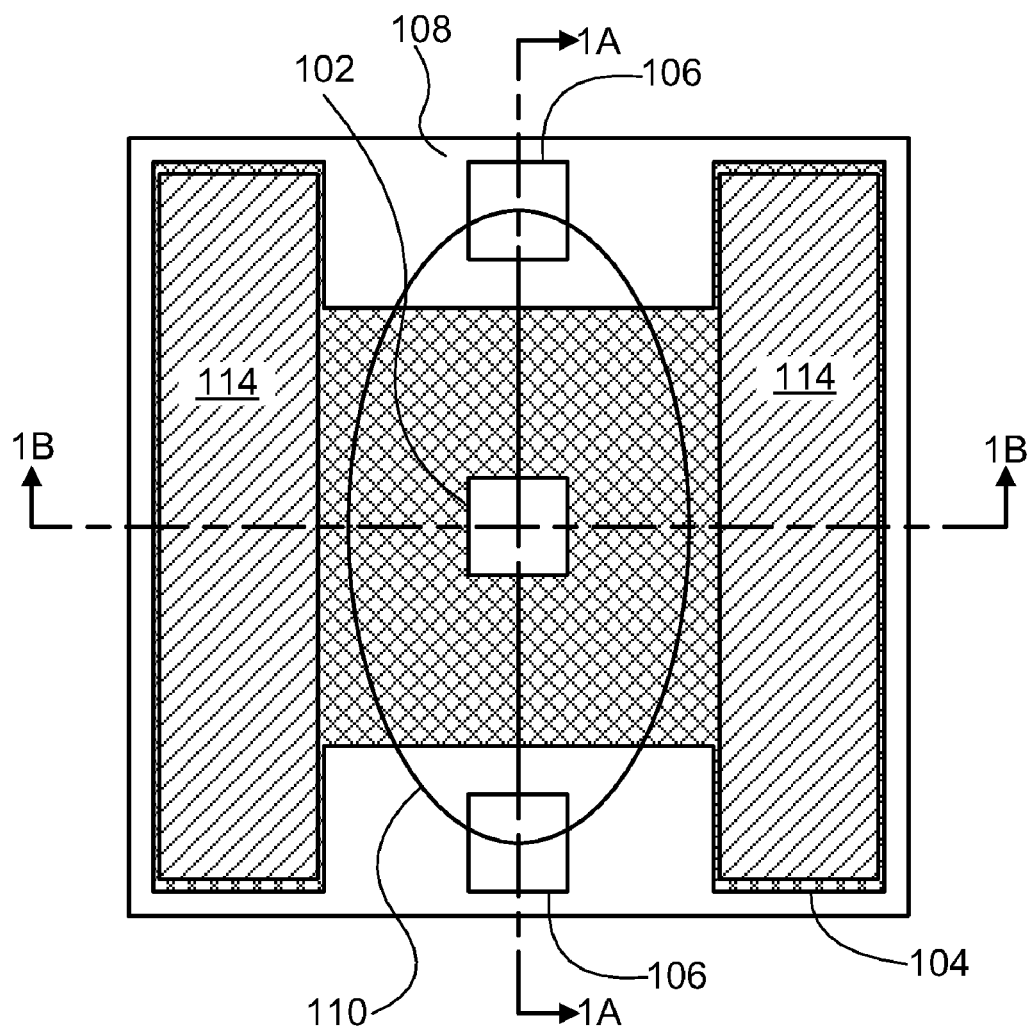
FIG. 1C is a cross-section top view of the LED package of FIGS. 1A and 1B.

FIG. 1C illustrates a cross-section top view of the package 100 of FIGS. 1A and 1B. Again, the semiconductor die 102 is mounted onto the top surface of the heat spreader 104. The semiconductor die is wire bonded to electrical contacts 106. A non-conductive plastic 108 electrically insulates the electrical contacts 106 from the heat spreader 104. The non-conductive plastic 108 may also form a reflector 110. At least one heat slug 114 is mounted on top of the heat spreader 104.

The non-conductive plastic 108 may be, for example, polyphthalamide (PPA). The high thermal conductive plastic slug(s) 114 may be, for example, a high heat-resistant resin, such as Liquid Crystal Polymer (LCP), Polyphenylene Sulfide (PPS), PolyEtherEtherKetone (PEEK), or polysulfone, which has been loaded with a thermally conductive additive, for example, graphite fibers, aluminum nitride, or boron nitride. Suitable high thermal conductive plastics are commercially available from, for example, Cool Polymers, Inc., 333 Strawberry Field Rd, Warwick, R.I. 02886 USA.

Figure 2:
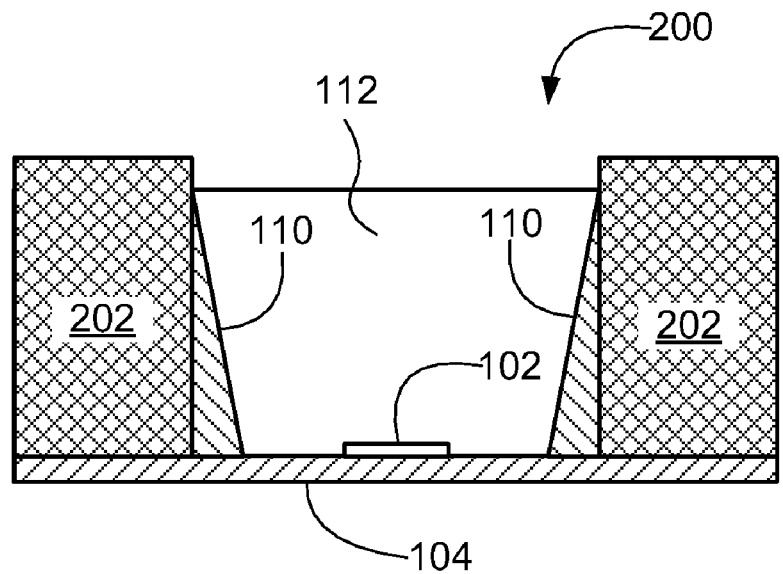
FIG. 2 is a cross-section side view of an example embodiment of a variation of the example of FIGS. 1A-1C.

FIG. 2 illustrates a variation of the example of FIGS. 1A-1C. For the LED package in FIG. 2, the tops, and at least one side, of the heat slugs 202 are exposed and are not covered by the non-conductive plastic or any encapsulating material. This improves heat dissipation.

Figure 3:
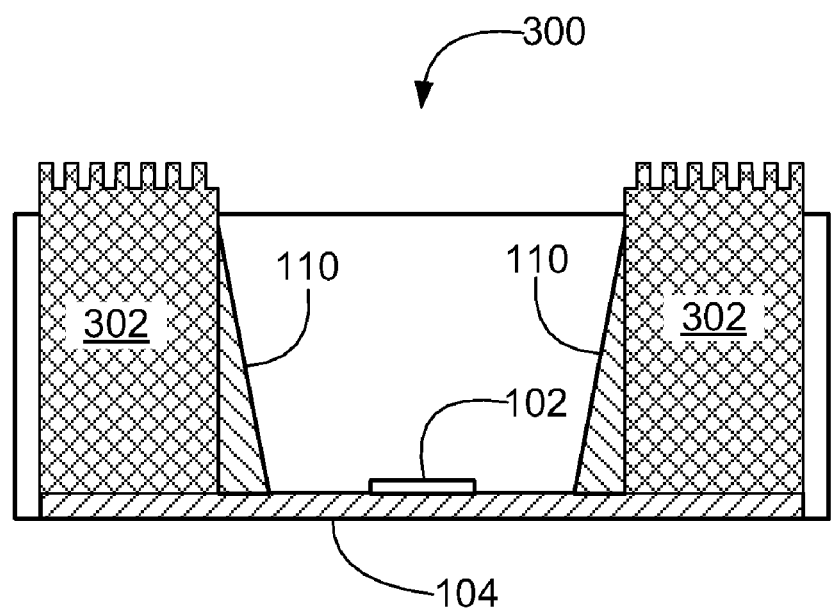
FIG. 3 is cross-section side view of an example embodiment of a LED package with optional heat dissipating structures formed on the top heat slugs.
Figure 4:
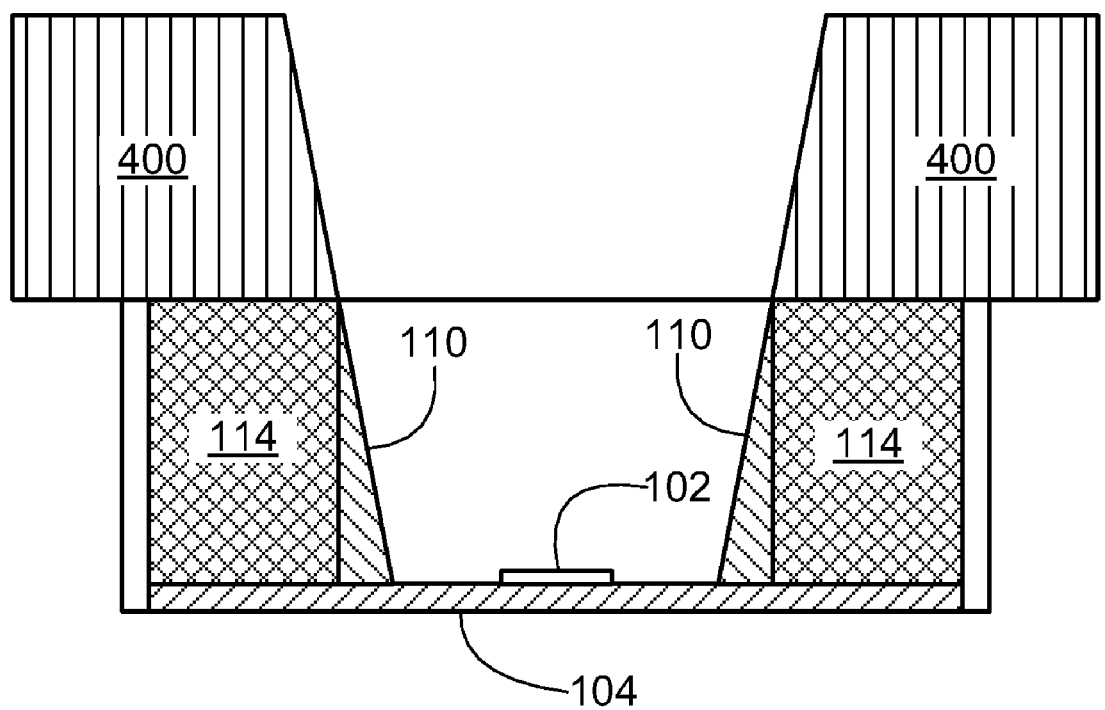
FIG. 4 is a cross-section side view of an example embodiment of a LED package with an optional secondary reflector cup.

FIG. 3 illustrates another optional enhancement. In FIG. 3, a package 300 has heat slugs 302 extending through the top of the package, and the heat slugs have additional surface structure, for example fins, to increase the surface area for improved heat dissipation. The heat slugs 302 may be high thermal conductive plastic and the surface structure may be molded as an integral part of the heat slugs FIG. 4 illustrates an optional enhancement to the LED package 100 of FIGS. 1A-1C. In FIG. 4, a supplemental reflector 400 is attached to the top of heat slugs 114 (or heat slugs 202 in FIG. 2). The supplemental reflector may be made of a high thermal conductive material to provide additional heat dissipation from the top of the overall assembly.

Figure 5:
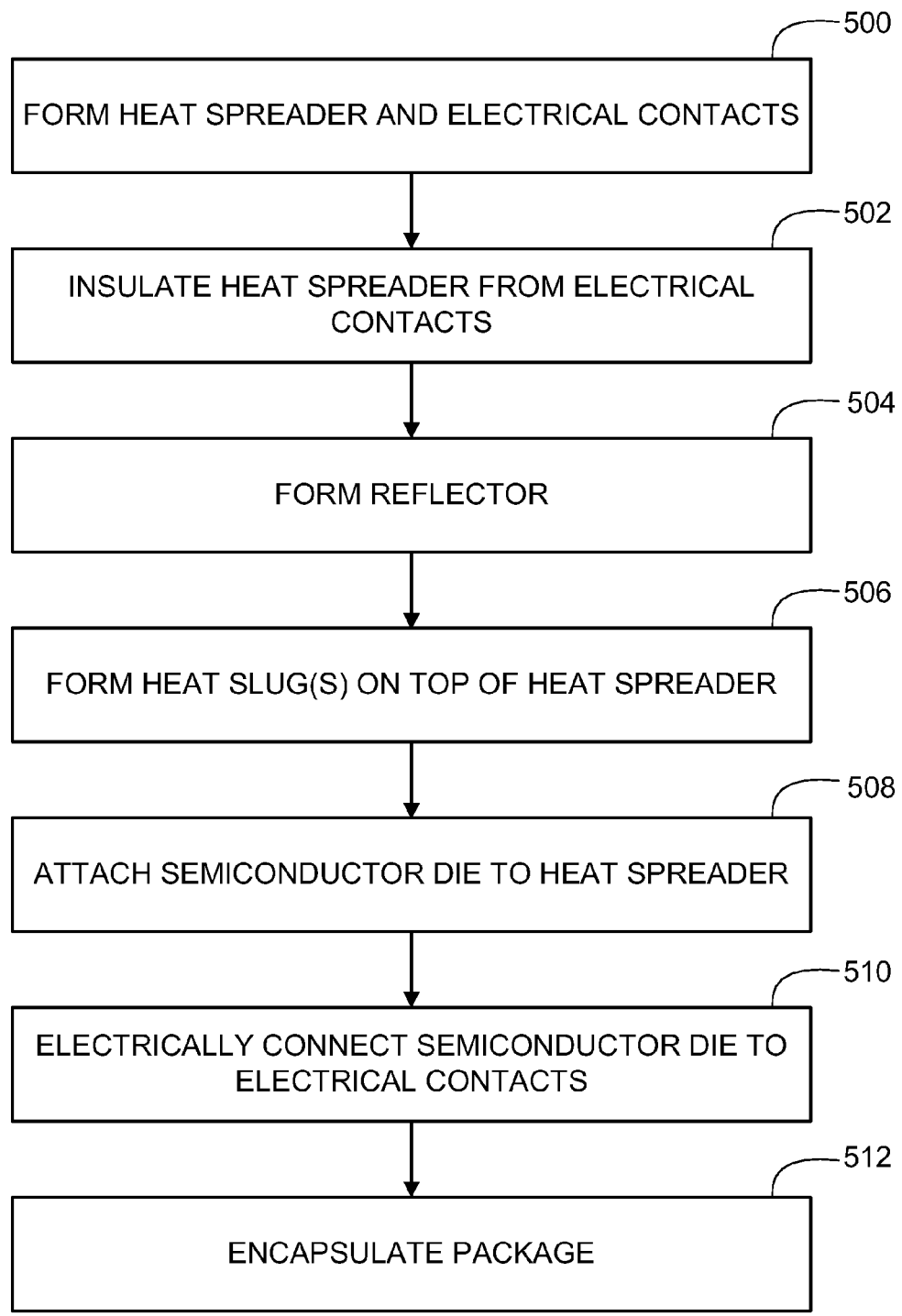
FIG. 5 is a flow-chart of an example method of manufacturing for a LED package.

FIG. 5 illustrates an example method for manufacturing an LED package. At step 500, a heat spreader and electrical contacts are formed (for example, stamped from a sheet of metal). At step 502, the heat spreader is insulated from the electrical contacts. At step 504, a reflector is formed (for example, steps 502 and 504 may be combined into one injection-molding step with a non-conductive plastic). At step 506, at least one heat slug is formed (for example, injection molding) onto the top side of the heat spreader. At step 508, a semiconductor LED die is attached to the heat spreader. At step 510, the semiconductor die is electrically connected to the electrical contacts (for example, by wire bonding). At step 512, the package is encapsulated (for example, by filling with epoxy or silicone).

What is claimed is:

1. An electronic assembly, comprising:
    a planar heat spreader;
    at least two electrical contacts, co-planar with the planar heat spreader, and electrically insulated from the planar heat spreader, the electrical contacts exposed at a bottom exterior surface of the electronic assembly;
    a Light Emitting Diode, attached to a top surface of the planar heat spreader and electrically connected to the electrical contacts; and
    at least one heat slug, mounted on the top surface of the planar heat spreader, the heat slug made from high thermal conductive plastic.

2. The electronic assembly of claim 1, further comprising a reflector attached to a top surface of the heat slug.

3. The electronic assembly of claim 1, wherein the planar heat spreader comprises a top surface and a bottom surface, wherein a top surface of the at least two electrical contacts coincide with the top surface of the planar heat spreader, and wherein a bottom surface of the at least two electrical contacts coincide with the bottom surface of the planar heat spreader.

4. The electronic assembly of claim 1, wherein a thickness of the planar heat spreader is substantially equal to a thickness of the at least two electrical contacts.

5. The electronic assembly of claim 1, where a top surface of the heat slug is exposed to the outside of the package.

6. The electronic assembly of claim 5, further comprising features on the top surface of the heat slug to increase the surface area of the top surface of the heat slug.

7. The electronic assembly of claim 1, where the electrical contacts are electrically insulated from the planar heat spreader by a non-conductive plastic.

8. The electronic assembly of claim 7, further comprising a reflector formed from the non-conductive plastic.

9. The electronic assembly of claim 8, wherein the non-conductive plastic comprises polyphthalamide.

10. The electronic assembly of claim 1, wherein the planar heat spreader is made of a flat sheet of metal and wherein the at least two electrical contacts comprise a thickness that is substantially equal to a thickness of the flat sheet of metal.

11. The electronic assembly of claim 10, further comprising an insulator that electrically insulates the planar heat spreader and the at least two electrical contacts, wherein the insulator is co-planar with the planar heat spreader and the at least two electrical contacts.

12. The electronic assembly of claim 11, wherein the insulator has a thickness that is substantially equal to the thickness of the flat metal sheet.

13. The electronic assembly of claim 1, wherein the high thermal conductive plastic comprises a high heat-resistant resin that has been loaded with a thermally conductive additive.

14. The electronic assembly of claim 13, wherein the high heat-resistant resin comprises at least one of Liquid Crystal Polymer, Polyphenylene Sulfide, PolyEtherEtherKetone, and polysulfone.

15. The electronic assembly of claim 14, wherein the thermally conductive additive comprises at least one of graphic fibers, aluminum nitride, and boron nitride.

16. An electronic assembly comprising:
first means for conducting heat from a LED semiconductor die to a back surface of the assembly, the first means for conducting heat comprising a flat metal sheet;
second means for conducting heat from the first means for conducting heat to a front surface of the assembly; and
electrical contacts electrically connected to the LED semiconductor die, where the electrical contacts are co-planar with the first means for conducting heat such that a top surface of the electrical contacts coincide with a top surface of the flat metal sheet and a bottom surface of the electrical contacts coincide with a bottom surface of the flat metal sheet.

* * * * *